United States Patent [19]

Myron

[11] Patent Number: 4,761,559
[45] Date of Patent: Aug. 2, 1988

[54] ION BEAM IMPLANTATION DISPLAY METHOD AND APPARATUS

[75] Inventor: Douglas D. Myron, Austin, Tex.

[73] Assignee: Eaton Corporation, Cleveland, Ohio

[21] Appl. No.: 911,240

[22] Filed: Sep. 24, 1986

[51] Int. Cl.4 .............................................. H01J 37/30
[52] U.S. Cl. ................ 250/492.21; 250/397; 250/398; 324/713
[58] Field of Search ............... 250/492.21, 397, 398, 250/252.1; 324/71.3

[56] References Cited

U.S. PATENT DOCUMENTS 4,514,637 4/1985 Dykstra et al. ............... 250/492.21

FOREIGN PATENT DOCUMENTS 57-40846 3/1982 Japan .............................. 250/492.21

OTHER PUBLICATIONS

McKenna, *Springer Series in Electrophysics, vol. 10: Ion Implantation Techniques*, 1982, pp. 73–103.

Primary Examiner—Bruce C. Anderson
Assistant Examiner—Jack I. Berman
Attorney, Agent, or Firm—Watts, Hoffmann, Fisher & Heinke

[57] ABSTRACT

A display system for use in monitoring ion beam characteristics of an ion beam implantation system. The display includes a cathode ray tube having vertical and horizontal deflection controls. The vertical deflection control is modulated by an indication of ion beam current impinging upon a target wafer. The horizontal deflection control is modulated with a signal related to beam scanning by a deflection electrode. The resultant image provides a system operator with a visual indication of the ion beam.

10 Claims, 9 Drawing Sheets

ION BEAM IMPLANTATION DISPLAY METHOD AND APPARATUS

TECHNICAL FIELD

The present invention relates to an ion beam implantation system and more particularly relates to method and apparatus to aid in positioning an ion beam on a target.

BACKGROUND ART

One technique for doping silicon wafers is to direct a beam of ions to impinge upon a wafer to produce controlled concentrations of doping impurities within the wafer.

In medium and low current ion implanters an ion beam is directed across a wafer surface by x-y deflection scanning of the beam in a raster or similar pattern. This has been done using two orthogonal pairs of electrostatic deflection plates to produce the beam deflections. Application of triangular waveform voltages to the deflection plates can produce rectangular raster scan patterns on the wafer. U.S. Pat. No. 4,514,637 to Dykstra et al. discloses one such medium to low current ion implanter. The disclosure of the Dykstra et al. patent is incorporated herein by reference.

Traditional deflection systems use a high frequency scan in one direction and a low frequency scan in an orthogonal direction to sweep across a circular semiconductor wafer. The relationship between the low and high scan frequencies is selected to produce a highly interlaced lissajous pattern. The scan pattern produced at the target is rectangular or square and includes portions that overscan the circular wafer.

Prior art ion beam scanning systems utilize visual displays that aid in focusing the ion beam and in centering the ion beam scanning pattern about the workpiece. These prior art displays use signals proportional to ion beam current to deflect a cathode ray tube display vertically as a horizontal sweep of the display is synchronized with the ion beam deflection voltages.

The square pattern generated by a combination of high and low frequency scan signals necessitates two visual displays for beam tuning and centering. One low frequency horizontal sweep on a first display is synchronized with the low frequency scan signal and a second high frequency horizontal sweep on a second display is synchronized with the high frequency scan signal. To achieve an optimum scan pattern with a single display monitor a user must switch back and forth between the two displays. Experience with this type of beam tuning indicates that the display may not accurately depict the shape and/or trajectory of the ion beam. If, for example, there is a malfunction that affects one display but not the other improper beam treatment might go unnoticed with adverse affect on dose uniformity and product yields from the doped semiconductor wafer.

If the user is to rely upon a visual display for beam focusing and centering, the display must accurately depict the beam scanning pattern. Prior art displays trigger horizontal sweeps of a cathode ray tube with the ion beam deflection voltages and deflect the CRT imaging ray vertically based upon the ion beam current. It is known, however, that it takes the ion beam a certain time to pass from the region of the deflection plates to the workpiece. To compensate for this time of flight lag, prior art systems delay the CRT sweep trigger a constant time period to coordinate the beam deflection with the beam current.

DISCLOSURE OF THE INVENTION

The present invention allows an ion beam to be more accurately centered on a workpiece to assure uniform dose and therefore high yield in the semiconductor devices fabricated from the workpiece.

The apparatus of the invention includes a video display such as a conventional cathode ray tube (CRT) having a viewing screen and control inputs for deflecting a cathode ray in an x-y plane. Ion beam current impinging upon the workpiece is measured indirectly and converted into a beam current signal which is used to deflect the CRT beam in the y or vertical direction.

An ion beam scanning electrode causes the ion beam to deflect across the workpiece in a well-defined scanning pattern. The visual display is coordinated with this scanning. In one particular embodiment of the invention a deflection voltage generation circuit synchronizes the horizontal scan of the display with vertical scanning of the ion beam across the workpiece.

Since the ion beam is moving with a finite speed when it passes through the scanning electrode, it takes a small yet measurable time for the ion beam to pass from the vicinity of the electrode to the workpiece. To take into account this time period, a delay circuit delays the generation of horizontal scan CRT deflection signals by an amount that takes into account this ion beam time of flight. An additional factor that must be taken into account when synchronizing the visual display with the ion beam current is the time it takes to convert the ion beam current into a voltage signal to deflect the CRT beam.

In accordance with one aspect of the invention, a delay used to synchronize the display controls is adjustable. This delay can therefore be modified depending upon the energy of the ion beam, the particular mass and charge of the ion used for beam treatment of the workpiece, and any inherent delay in the system electronics. To the applicant's knowledge no prior art system has taken these variables into account in an ion beam display system.

Due to the particular scanning procedure utilized in accordance with the invention, the horizontal and vertical scanning frequencies of the beam deflection voltages are approximately the same. Additional details of the advantages of this type ion beam scanning may be obtained by reference to copending patent application Ser. No. 911,238, now U.S. Pat. No. 4,796,107, entitled "Ion Beam Implanter Scan Control System," to Myron, filed concurrently with the present application and assigned to the Eaton Corporation. The disclosure of this copending application is incorporated herein by reference.

When a signal related to the ion beam current impinging upon the workpiece is used as a vertical CRT beam deflection control and the electrode scanning signal is coordinated with the horizontal sweep of a CRT beam, the resulting display on the cathode ray screen can be interpreted by the system operator and provides an indication of the ion beam characteristic. Specifically, this display can be used to focus the beam to center the beam and properly overscan the ion beam across the workpiece to assure correct beam dose distribution as the scanning electrode sweeps the ion beam across the wafer.

An off center ion beam produces a characteristic display signature that can be identified by the user and corrected using controls that apply a voltage offset to the scanning electrodes. Thus, if in the operator's opinion, the display indicates a problem with the vertical displacement of the ion beam, the user can correct this defect by applying an offset voltage to the vertical scanning electrode.

In the particular arrangement of the invention, the ion beam current is continuously monitored and once the ion beam scans off the surface of the workpiece in its scanning pattern, the ion beam current goes to zero. By comparing this current with a reference value at appropriate times during the ion implantation scan, the system can automatically determine a misaligned ion beam. In accordance with another aspect of the invention, an audible warning is generated to supplement the user's visual monitoring of the ion beam display.

From the above it is appreciated that one object of the invention is an improved ion beam display for monitoring and controlling an ion beam implantation operation. Other objects, advantages and features of the invention will become better understood by review of a detailed description of one embodiment of the invention in conjunction with the accompanying drawings.

BEST MODE FOR CARRYING OUT THE INVENTION

Figure 1:
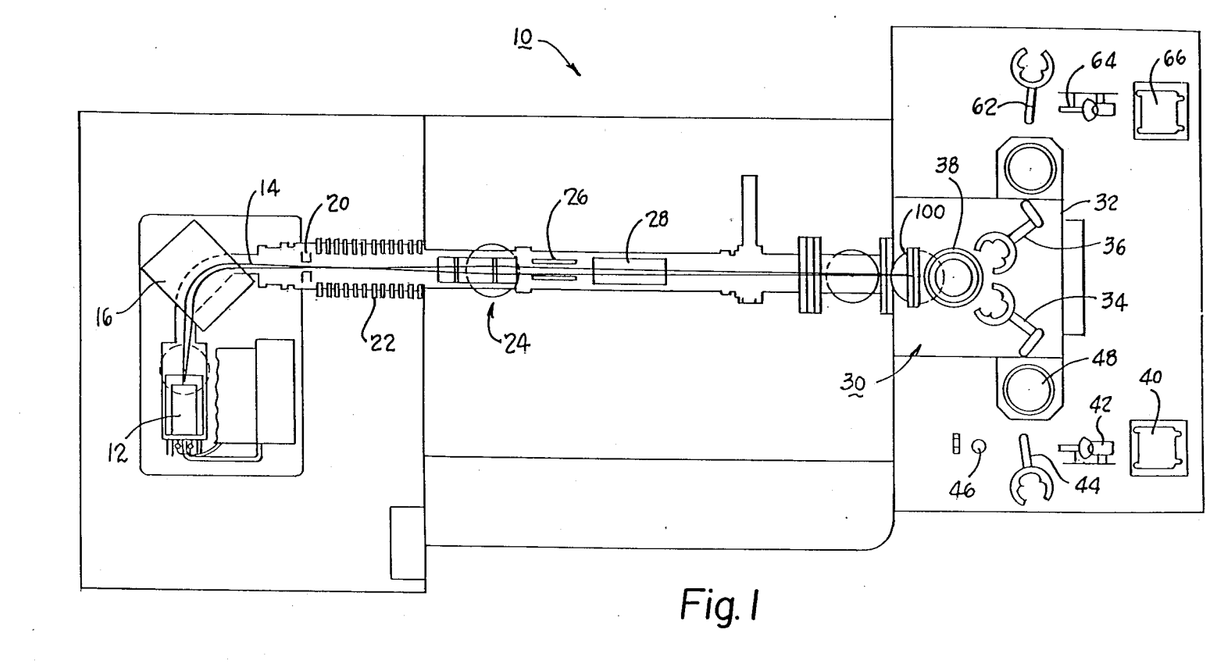
FIG. 1 is a schematic of an ion beam scanning implantation system for treating a generally circular workpiece.

Turning now to the drawings, an ion implantation system 10 is illustrated having an ion source 12 for directing an ion beam 14 to an ion mass analyzing magnet 16 which bends the beam at right angles and directs the beam along an elongated travel path through a beam shutter 20 and accelerating electrodes 22. Subsequent to passing through the electrodes 22, the beam passes through a quadruple lens system 24 that focuses the beam. The beam 14 then passes through two pairs of deflection electrodes 26, 28. Control voltages applied to the electrodes 26 create electric fields which deflect the ion beam 14 from side to side and control voltages applied to the electrodes 28 deflect the ion beam up and down. The deflected ion beam is then directed to an ion implantation station 30 where a silicon wafer 100 is positioned in the beam path. By modulating the scanning voltages applied to the scanning electrodes 26, 28, the beam 14 scans across the wafer.

The ion implantation station 30 is located in an evacuated chamber 32. Two arms 34, 36 mounted within the chamber 32 automatically load and unload wafers to and from a wafer support 38. Undoped wafers are retrived from a cassette 40 by a shuttle 42 which brings a single wafer to the vicinity of an arm 44 which moves the undoped wafer to an orienter 46. The orienter rotates the undoped wafer to a particular crystal orientation. The arm 44 retrieves the suitably oriented wafer and moves it into a loading station 48 next to the evacuated chamber 32. The loading station 48 closes, is pumped down to vacuum, and opens into the chamber 32. The arm 34 grasps the wafer, brings it within the chamber and places it on the support 38 at a load/unload position. The support includes a mechanism to first clamp the wafer and then pivot the wafer to a generally vertical orientation with a wafer surface facing the ion beam 14. In most systems, a small angle of tilt is intentionally produced to avoid channeling affects.

On a unload side of the chamber 32, the second arm 36 grasps a doped wafer from the support 38, and removes it from the chamber 32. An arm 62 moves the wafer to a shuttle 64 which automatically places the wafer into a second cassette 66.

Application of suitable energization voltages to the deflection electrodes 26, 28 causes the beam to deflect away from its initial trajectory to scan across the vertically oriented wafer.

Figure 2:
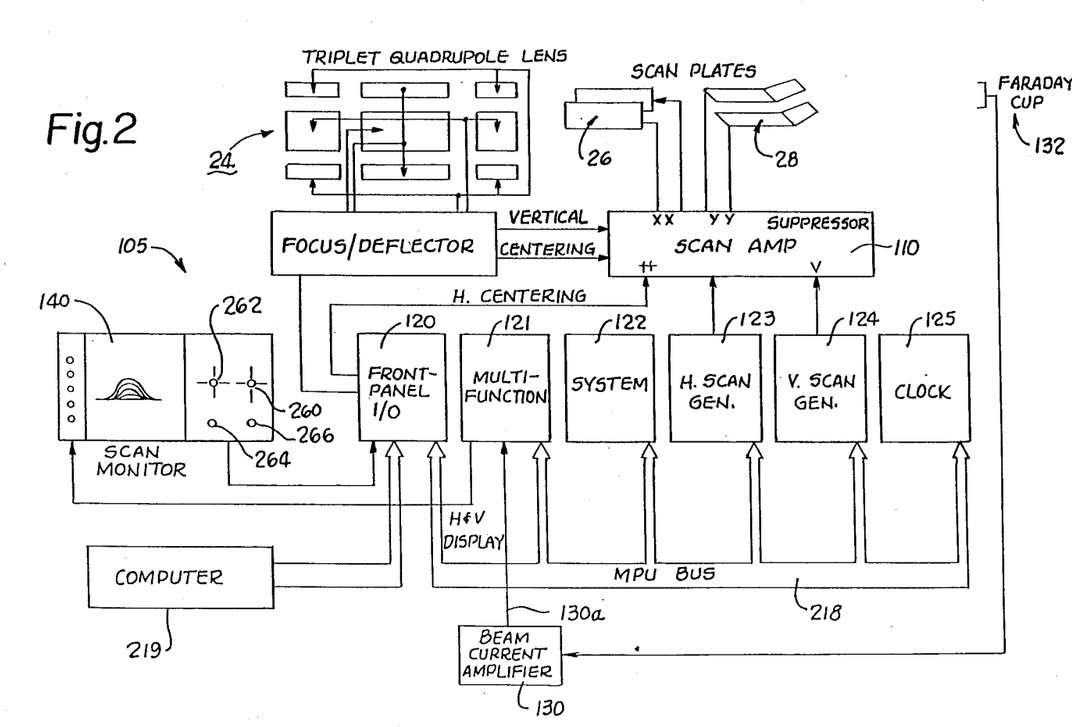
FIG. 2 is a schematic of a scanning system for controllably deflecting an ion beam away from an initial trajectory to scan across the circular workpiece.
Figure 3:
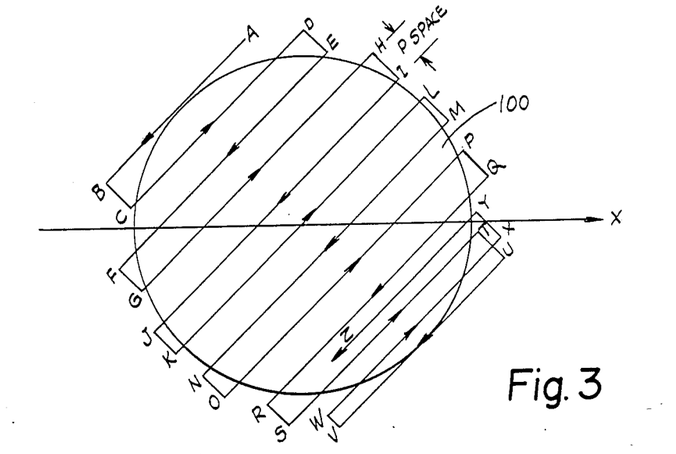
FIG. 3 shows an ion beam scanning pattern across the surface of a circular workpiece.

Turning now to FIGS. 2 and 3, a scan control system 105 is seen coupled to the horizontal and vertical deflection electrodes 26, 28 through a scan amplifier 110. The scan amplifier 110 includes high voltage amplifiers coupled to transformers for converting a low voltage waveform into a high voltage sawtooth signal to deflect the ion beam 14 up and down and side to side.

A representative scanning pattern for the ion beam 14 is depicted in FIG. 3. Scanning begins at a point designated A in FIG. 3 and continues in a series of regularly spaced diagonal segments passing across the workpiece at an angle of approximately 45° with respect to a horizontal axis. After one complete pass across the wafer 100, the ion beam 14 is deflected a small amount in comparison to the normal spacing between beam segments and reverses its path across the wafer. As seen in FIG. 3, the ion beam 14 spends most of its time implanting the wafer and a relatively short period of time stepping between diagonal wafer implant scan segments.

Figure 7:
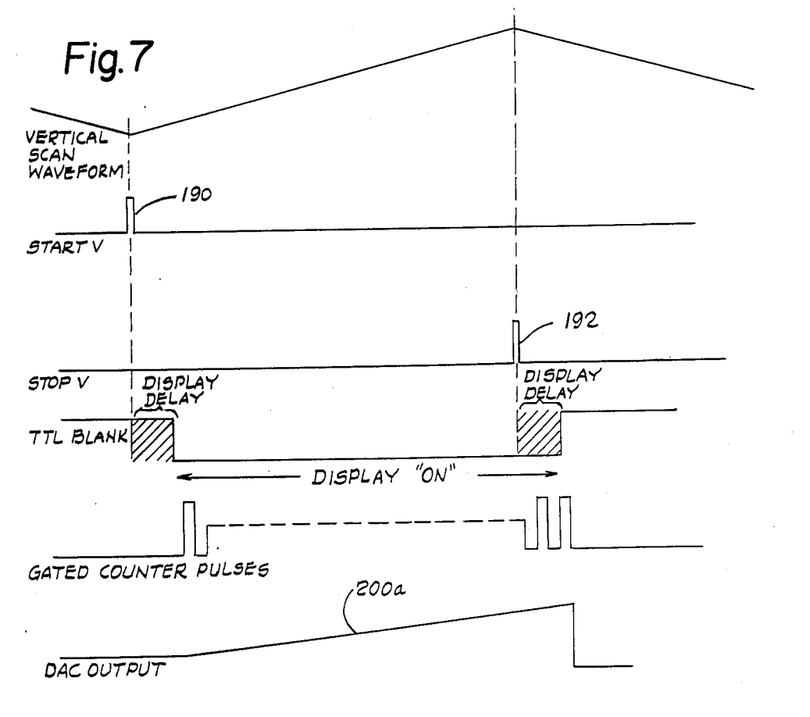
FIG. 7 illustrates timing diagrams for a scanning electrode voltage and display control signal utilized in synchronizing the system display with the ion beam deflection.
Figure 9:
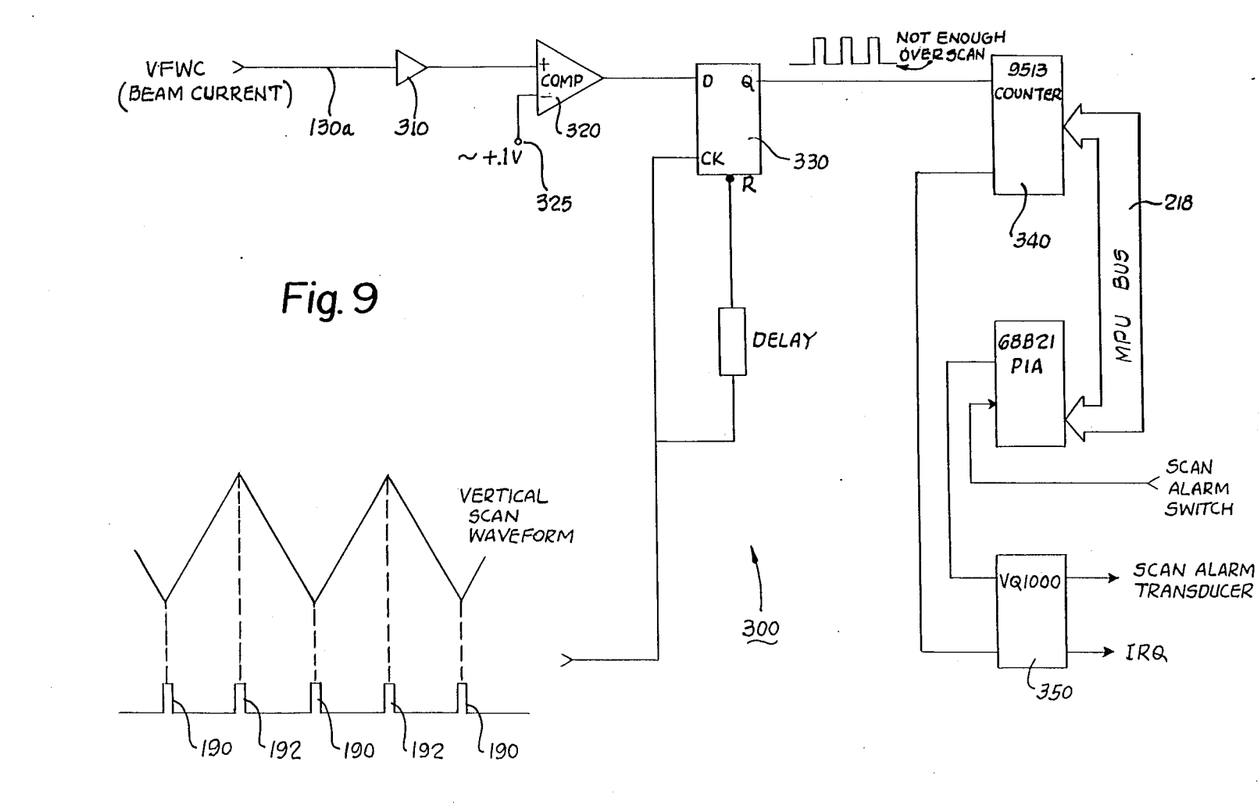
FIG. 9 shows a schematic of a scan alarm constructed in accordance with the invention.

As disclosed in the copending and incorporated patent application entitled "Ion Beam Implanter Scan and Control System" the scan pattern of FIG. 3 is accomplished by application of two sawtooth waveforms to the vertical and horizontal deflection electrodes 26, 28 having approximately the same frequency and coordinated in time by a number of scanning control circuits 120-125. Segments of typical vertical electrode energization waveforms are shown in FIG. 7A and FIG. 9. As these waveforms energize the vertical electrodes 28 coordinated waveforms are applied to the horizontal electrodes 26 to achieve the scanning pattern of FIG. 3.

A beam current amplifier 130 is coupled to a faraday cup sensor 132 to generate an output signal at an output 130a corresponding to the ion beam current impinging upon the wafer 100. This output falls off or goes to a minimum value when the ion beam 14 is no longer impinging upon the workpiece and achieves a relatively stable maximum value as the ion beam 14 scans across the workpiece. As the ion beam 14 crosses an edge region between the wafer and its support, the ion beam current rapidly increases or decreases depending upon whether it is entering or leaving the wafer surface.

A beam display monitor or CRT 140 is used as a diagnostic aid. By viewing the monitor 140, a user can both center the ion beam 14 along a correct travel path, adjust the amount of beam overscan and focus the beam into a correct shape that produces uniform ion implantation of the workpiece.

In accordance with a preferred embodiment of the invention, a horizontal sweep control of the CRT 140 is synchronized with an output from a vertical scan generation circuit 124 coupled to the scan amplifier 110. A vertical deflection of the CRT 140 is coupled to the output 130a of the beam current amplifier 130 and produces a cathode ray tube beam deflection proportional to the ion beam current impinging upon the wafer. With these controls, the CRT 140 produces display outputs as shown in FIGS. 6A-6D.

Figure 6A:
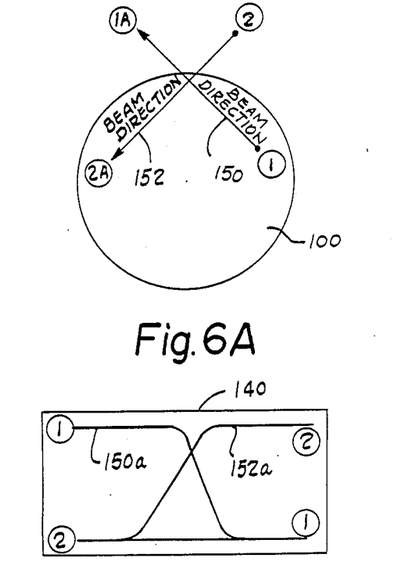
FIGS. 6A-6D illustrate display signatures of three off-center ion beam scans and one ion beam scan (6D) that is properly centered.

Turning now to FIG. 6A, two ion beam scan segments 150, 152 are shown scanning across a semiconductor wafer 100 in mutually orthogonal directions at different times during an ion implantation sequence. These segments are typical scan segments for a so-called octogonal scan pattern that is somewhat different from the pattern of FIG. 3. The visual depiction of the two segments 150, 152 is seen on the monitor 140 as two CRT sweeps 150a, 152a that experience a transition approximately midway across the CRT screen. The beam configuration in FIG. 6A is not properly centered and is experiencing too great a deflection as it passes through the vertical deflection electrodes 28. This situation can be compensated by modifying a vertical offset voltage applied by the scan amplifier power supply.

Figure 6B:
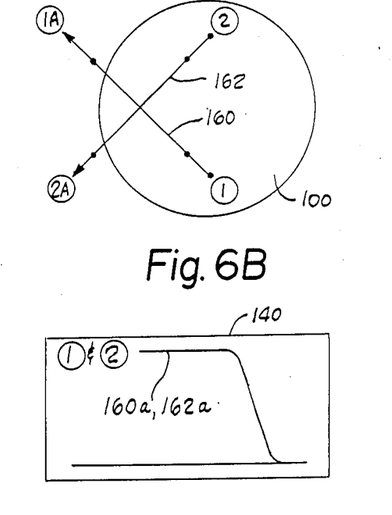
Figure 6C:
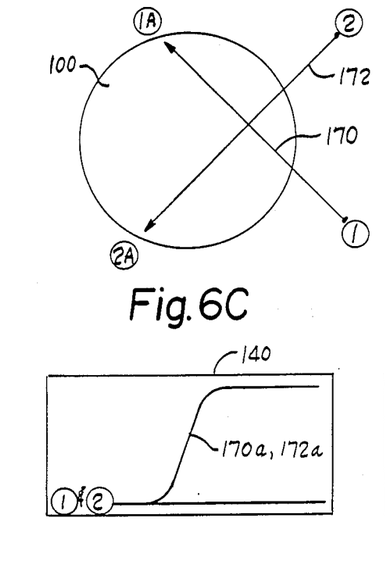

FIG. 6B depicts two scan segments 160, 162 that are offset from the center of the wafer in a manner that produces the CRT sweeps 160a, 162a on the monitor 140. In this configuration both scan segments 160, 162 begin the scan segment on the wafer 100 and therefore the ion current begins at a maximum for both CRT sweeps 160a, 162a and moves off the wafer 100 at approximately the same time. A third situation is illustrated in FIG. 6C. In this instance, each of two scan segments 170, 172 begins scanning off the wafer 100 and ends the scan segment while on the wafer to produce the monitor display patterns 170a, 172a of FIG. 6C.

Figure 6D:
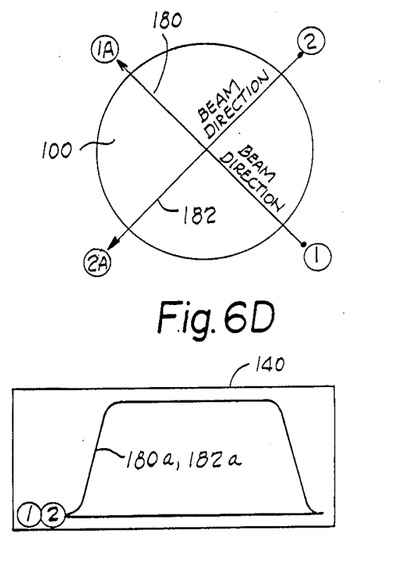

Finally, a correctly centered scanning pattern having two segments 180, 182 is shown in FIG. 6D. Each segment begins scanning from a position off the wafer where the ion current is at a minimum, scans uniformly across the wafer, and leaves the wafer surface causing the ion beam current to fall to its minimum value. The CRT sweeps 180a, 182a form the plateau display signature of a well centered, proper amplitude deflection.

The waveforms in FIGS. 6A-6D depicting the ion beam pattern are repeated many times a second, causing the system operator to see waveforms from many different scan segments (FIG. 3) at the same time. In one embodiment of the invention, for example, the scanning system 105 completes an entire scan sequence defined by approximately 4,000 points (the first few of these end points are designated A-Z in FIG. 3) in 65 milliseconds. Many segments of this so-called fine frame appear to be depicted simultaneously on the monitor 140 and the resultant image that the viewer or system operator observes is similar to the depictions in FIGS. 10A-10J.

As noted above, the horizontal sweep of the monitor 140 is synchronized with a vertical scan waveform (FIG. 7) that is coupled to the vertical deflection electrodes 28. The vertical scan generator circuit 124 generates pulses 190, 192 that are synchronized with the beginning or end of a vertical scan waveform (FIG. 7). These two pulses 190, 192 are schematically depicted in a timing diagram of FIG. 7.

One possible beam display procedure would synchronize the beginning of the horizontal CRT sweep with the generation of the start signal 190 and unblank the display. Upon receipt of the stop signal 192 the display would then be blanked. If the y deflection control of the CRT 140 is then driven by an ion beam current signal, a display output is generated on the monitor 140 representative of the ion beam configuration.

Such a system, however, would not take into account the time of flight of the ions as they travel from the vertical deflection electrodes 28 to impact the wafer 100 at the implantation station 30. The time of flight varies as the distance from the scan plate to the target, beam energy, charge, and mass of ions within the ion beam. The beam current must also be measured and converted into a voltage control which adds to the delay. This total time will be referred to below as the display delay.

Figure 4A:
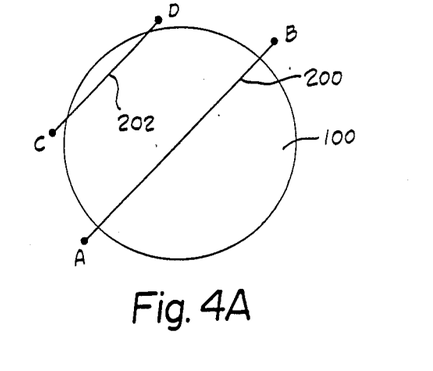
FIGS. 4A-4D illustrate timing requirements for an ion beam display.
Figure 4B:
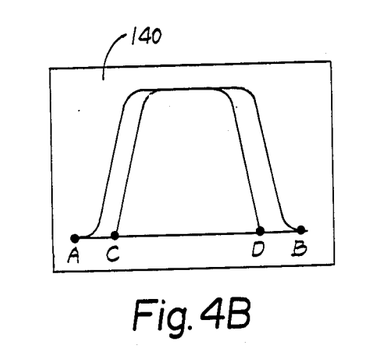
Figure 4C:
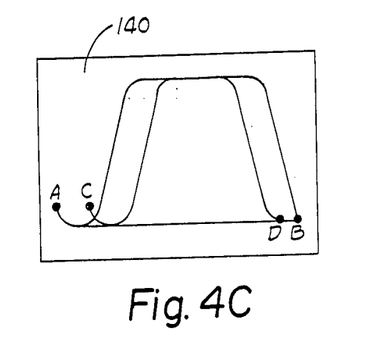
Figure 4D:
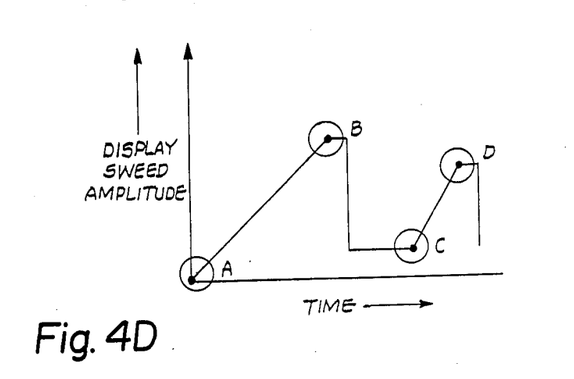

Turning now to FIGS. 4A-4D, two scan segments 200, 202 traversing the wafer 100 are utilized as display triggers to produce the display patterns of FIGS. 4B and 4C. These segments conform to the type of scanning segments needed to perform the FIG. 3 scanning sequence. In the FIG. 4C depiction no display delay is introduced. For the scan segment 200, the display begins at point A and ends at point B. Since the beam sweep at point A is triggered from the deflection voltage, the ion beam current has not had a chance to catch up with the horizontal control for the monitor 140. At the start of the display of FIG. 4C an ion beam current attributable to a previous sweep segment as the ion beam ends its previous sweep across the workpiece is depicted.

Figure 5A:
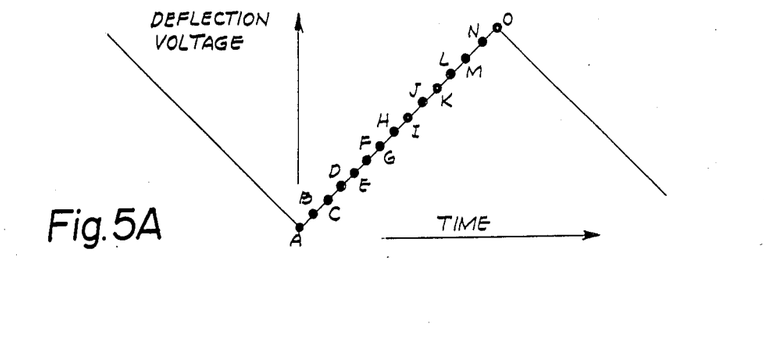
FIGS. 5A-5C illustrate the affects of time of flight on the implantation display.
Figure 5B:
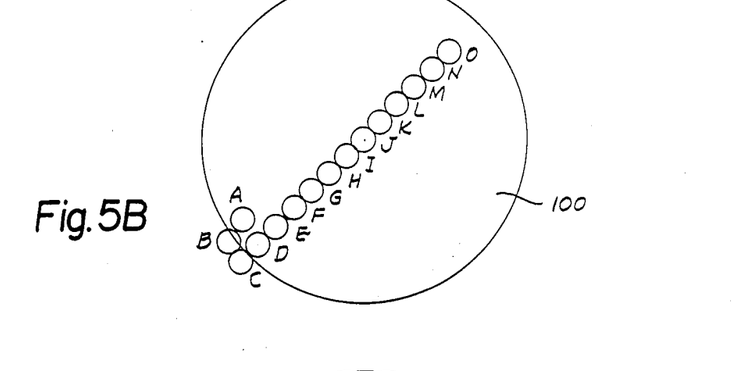
Figure 5C:
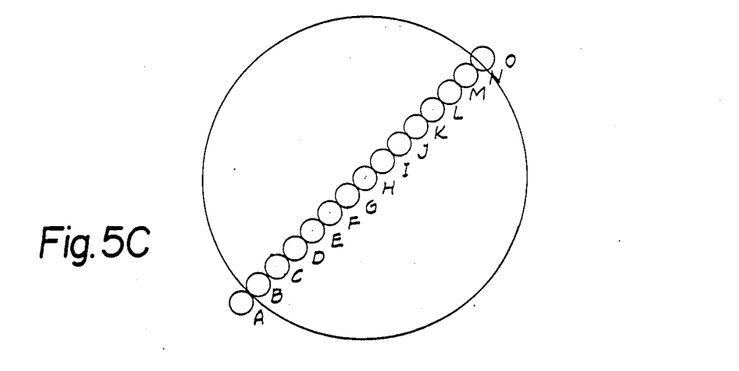

This sequence of events is also schematically depicted in FIGS. 5A-5C. FIG. 5A is a time vs. voltage plot of the deflection voltage at points A-O. Without a display delay the deflection voltage leads the ion beam signal so the ion beam current at time A (FIG. 5A) corresponds to an ion beam still crossing the wafer 100 at point A of FIG. 5B. On the monitor 140 this would correspond to a display illustrated in FIG. 4C where a non-zero ion beam current is depicted as the horizontal CRT sweep begins. To synchronize the deflection voltage (FIG. 5A) with beam position as evidenced by ion current (FIG. 5C) a display delay is inserted between the generation of the STARTV pulse 190 and the CRT horizontal beam sweep. With this display delay the CRT monitor displays the "plateau signature" (FIG. 4B) corresponding to two properly centered correct amplitude scan segments.

Circuitry 200 (FIG. 8) for instituting a delay of the horizontal monitor sweep is located in the multifunction circuit 121. The circuitry 200 takes into account the time of ion beam flight between the deflection electrodes 26, 28 and the wafer and the time needed to generate an output voltage corresponding to the ion beam current. Two inputs 210, 212 receive the start and stop pulses 190, 192 synchronized with the vertical scan voltage. These inputs are coupled to an OR gate 214 having an output 214a coupled to a counter 216. The counter 216 is programmable and is coupled to a system data bus 218 to allow the system circuit 122 (FIG. 2) to load a delay count into the counter 216. This count corresponds to the total display delay needed.

Figure 8:
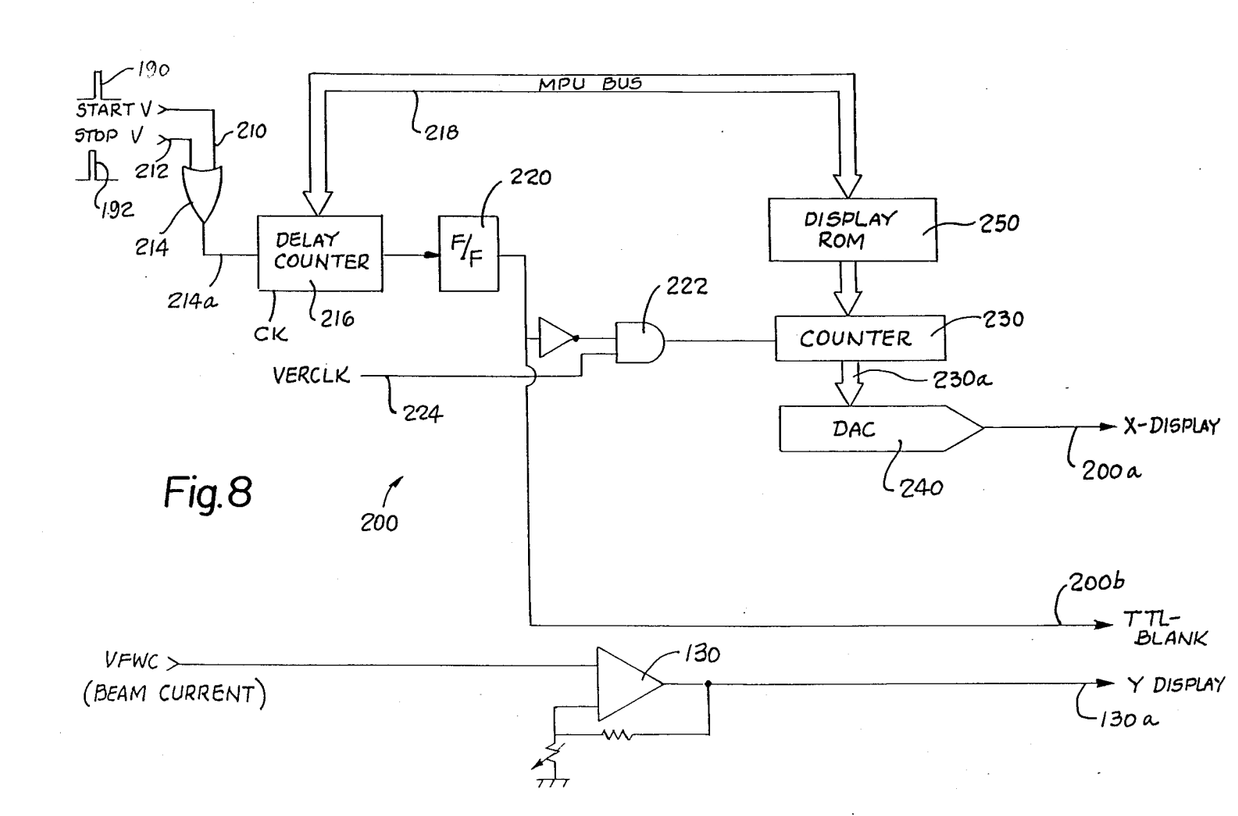
FIG. 8 is a schematic of circuitry for generating x and y deflection voltages for a CRT display.

The correct count varies with ion species, beam energy and beam current electronics. A computer 219 automatically downloads the beam energy and allows the system operator to enter the ion species and charge so that the system circuit, which includes its own microprocessor executing a computer program can calculate an appropriate display delay count.

The function of the FIG. 8 circuit is to coordinate the generation of signals at two outputs 200a, 200b that produces a monitor display that accurately illustrates the beam shape and position on the wafer 100. One output 200b blanks the video monitor 140 and is coupled to an output of a flip-flop 220 that responds to an output from the delay counter 216. Until this flip-flop is triggered by an output from the counter 216 the monitor screen is blanked as illustrated in FIG. 7. When the delay counter times out an output to the flip-flop 220 unblanks the CRT screen and activates an AND gate 222 causing the AND gate to pass clock signals from a clock input 224 originating on the clock circuit 125. When the gate 222 is activated a second counter 230 begins counting up at the clock rate of the input 224 and generates a digital output 230a that is converted by a digital-to-analog converter 240 into a horizontal sweep voltage at the output 200a. This steadily increasing output 200a is depicted in FIG. 7 and causes the CRT beam to sweep at a constant rate (controlled by the VERCLK input 224) until the STOPV pulse 192 is received from the vertical scan generator 124. This STOPV pulse again triggers the counter 216 so that after the display delay times out the Flip-Flop 220 switches state, the AND gate 222 no longer passes clock signals and the CRT screen is blanked at the output 200b until the receipt of a next subsequent STARTV signal.

All ion beam scan segments (FIG. 3) are not the same length. Shorter scan segments such as the segment 202 of FIG. 4A are centered on the CRT monitor (see FIG. 4B) by loading an initial count into the counter 230 for each segment. Thus, although the output from the digital-to-analog converter ramps upward at the same rate for all scan segments, the beginning and ending voltages vary depending on the length of the scan segment.

The beginning count for each scan segment is stored in an electronically programmable read only memory 250 coupled to the system circuit 122 by the system data bus 218. This allows the memory 250 to be reprogrammed as needed based upon the configuration of the scan which in turn can be reprogrammed by changing the contents of memories (not shown) on the vertical and horizontal scan generator circuits 123, 124.

Each scan segment (200, 202 for example) has a trace length. In programming the memory 250 the length of a scan is subtracted from a maximum length segment and divided by two. This is the offset from which the display sweep starts the scan segment. The output from the digital-to-analog converter ramps up from this starting point at a constant rate until the screen is blanked and a next start value is loaded into the counter 230 for a next display sweep.

Turning now to FIGS. 10A-10J, a number of display images comprising a number of what appear to be simultaneous display sweeps are shown. These images will be contrasted with each other to help in evaluating the diagnostic capability of the invention. A properly focused and centered beam such as the scan of FIG. 3 presents an image similar to that shown in FIG. 10A. The beam outline is centered in the display (not chopped of on either side) and the loops caused by short scan segments are symmetric and smooth about an image centerline.

Figure 10A:
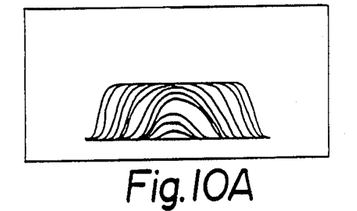
FIGS. 10A-10J illustrate representative displays indicating various ion beam conditions.
Figure 10B:
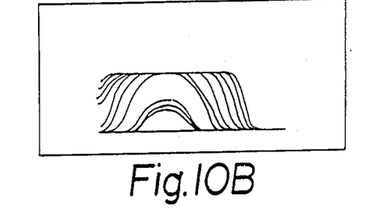

FIG. 10B shows a display corresponding to a beam that is uncentered in the plane of the wafer. A portion of the beam display is chopped off on the left side and is similar to the situation depicted in FIG. 6B. To correct for this condition, the user must apply a horizontal offset to the horizontal scan plate 26 by operating a joy stick control 262 located to the side of the monitor 140. Side-to-side movement of this control 262 centers the beam on the target by adjusting an offset voltage on the horizontal scan power supply. Up and down movement of this control 262 raises and lowers the total horizontal ion beam scan amplitude.

Figure 10C:
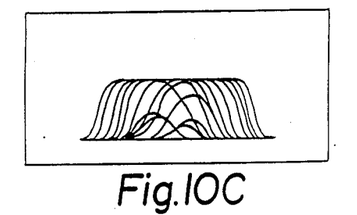

The display of FIG. 10C is not centered vertically. The beam outlines are not merged into a single image and appear similar to the situation depicted in FIG. 6A. Side to side movement of a vertical control joy stick 260 (FIG. 2) corrects this problem. Up or down movement of the second control 260 adjusts the vertical scan amplitude. This merging of the beam outline provides for very accurate and repeatable vertical beam centering necessary for use with correction factors.

Figure 10D:
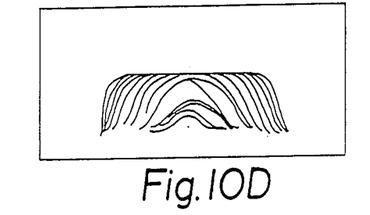
Figure 10E:
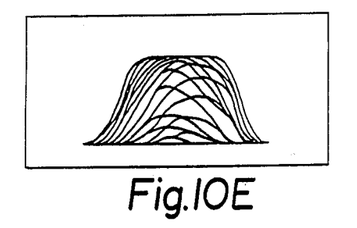
Figure 10F:
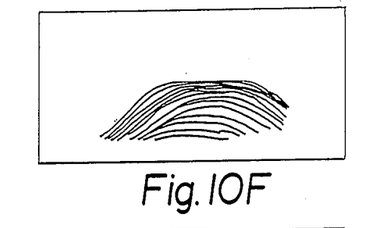
Figure 10G:
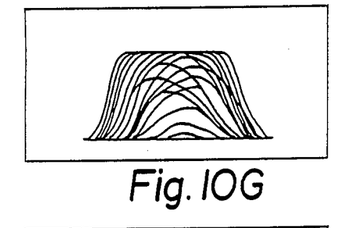
Figure 10H:
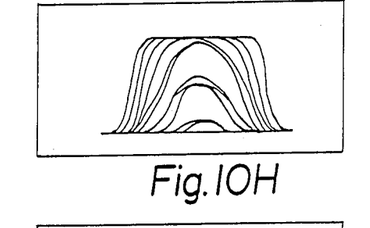

An underscan condition is illustrated in FIG. 10D. This is indicated since the ion beam current does not reach a uniform minimum value. There is no indication of which control 260, 262 should be adjusted but by moving both joy sticks and noticing which movement causes the humps in the display to disappear a correct scan amplitude can be achieved.

FIGS. 10E-10H indicate different displays observable while focusing the beam. Two dial controls 264, 266 are rotated to adjust beam focusing voltages coupled to the quadruple lens 24. FIGS. 10E-10H represent a sequence of display configurations the system operator produces in focusing the beam.

Figure 10I:
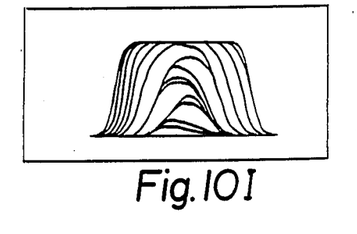
Figure 10J:
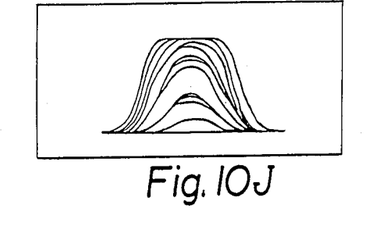

In the display of FIG. 10I, the display picture is generally normal except that the scan amplitudes are not well balanced. The visual indication of this condition is the appearance of two sets of loops within the beam outline that do not overlie the same vertical axis. This condition may be corrected by operating the amplitude controls 260, 262 in opposite directions, i.e. increasing one control while decreasing the other. The object is to achieve a beam appearance where the loops appear to be aligned about a center axis. The corrected display corresponding to two amplitudes (horizontal and vertical) of equal magnitude is depicted in FIG. 10J.

An operator experienced with the ion implantation system 10 and familiar with the various beam images depicted in FIG. 10 can quite accurately focus, center, and adjust the amplitude of the ion beam to produce a minimum amount of beam overscan. The importance of centering the scan pattern on the wafer is discussed in the aforementioned and copending patent application to Myron. Briefly, dose correction compensation occurs in a manner which is dependent upon the scan pattern being accurately centered about a wafer center and this dose compensation will be accurately performed only if the ion beam scan is centered.

Turning now to FIG. 9, a scan alarm system 300 for supplementing the visual display techniques of FIG. 10 includes circuitry for automatically generating an audible alarm in the event the ion beam is not properly centered or there is not enough beam overscan. This circuit takes advantage of the fact that each of the pulses generated at a vertical scan waveform transition region should occur off the wafer. Stated another way, each of the right angle bends in the scanning pattern of FIG. 3 should occur at a time when the ion beam current is at a minimum.

The circuit of FIG. 9 monitors beam current as the STOPV and STARTV pulses 190, 192 occur, the display delay is added to these pulses at which time the ion beam current is sampled. The number of occasions in which the ion beam current exceeds a threshold value is counted. A beam current input 130a is coupled to a buffer amplifier 310 having an output coupled to a non-inverting input of a comparator amplifier 320. A reference input 325 to the comparator 320 is adjustable depending upon the desired sensitivity of the scan alarm system. If the ion beam current causes an output voltage from the buffer amplifier 310 to exceed the reference input 325 then the comparator 320 generates a high output signal at the D input to a flip flop 330. The pulses 190, 192, 190 etc. clock the flip flop 330 so that the input at the D input is coupled to the flip-flop output Q. If the comparator output is high, this output clocks a programmable counter 340 programmed via the system data bus 218. If the number of pulses at the input to the counter exceeds the program threshold limit during a predetermined monitoring period, a scan alarm interface 350 is activated and an audible alarm warns the operator that the beam scan needs adjustment. By adjusting the threshold input 325 and threshold count stored in the counter 340 the sensitivity to beam alignment can be controlled. This is important in low dose implantations where the gain of the beam current amplifier is adjusted to be high and the system noise approaches the threshold voltage 325.

While the present beam display and alarm system has been disclosed in conjunction with a circular wafer ion implantation system utilizing diagonal scanning across the wafer provided by two saw tooth waveforms, one for energizing a horizontal and one for energizing a vertical electrode, the display delay and alarm systems have application in other systems. One important advantage of the system, however, occurs through the use of a diagonal scan created using horizontal and vertical sawtooth waveforms of about the same frequency. Both the horizontal and vertical deflection voltages can be diagnosed by viewing a single viewing monitor. This advantage is unavailable when using two scanning waveforms having frequencies of greatly dissimilar value.

Although the invention has been described with a degree of particularity, it is the intent that the invention include all modifications and all alterations falling within the spirit or scope of the appended claims.

I claim:

1. A method of controlling an ion beam for ion implantation of a workpiece comprising the steps of:
   directing an ion beam through sets of scanning electrodes, a first set of electrodes to deflect the ion beam in a first direction and a second set of electrodes to deflect the beam in a second direction orthogonal to the first direction;
   simultaneously energizing each set of scanning electrodes with first and second deflecting voltages to cause the ion beam to sweep over the workpiece;
   coordinating the frequency and amplitude of said deflecting voltages to cause said beam to scan across all regions of said workpiece;
   generating a signal related to the ion beam current striking said workpiece;
   triggering a sweep of an imaging ray across a screen by coordinating the sweep with one of said first and second deflecting voltages and depicting said beam current on said screen as said ray sweeps across the screen to create a single beam characterizing image on the screen; and
   adjusting the trajectory of the ion beam to cause said beam characterizing image to conform to a desired shape.

2. The method of claim 1 wherein the first and second deflecting voltages form sawtooth waveforms of approximately the same frequency.

3. The method of claim 1 comprising the additional step of generating a warning if the ion beam is not properly scanning the workpiece.

4. The method of claim 3 wherein the warning is generated by comparing the ion beam current with expected beam currents at different times during the ion beam treatment of said workpiece.

5. A scan alarm for use with an ion beam implantation system comprising:
   ion beam sensing means for monitoring ion beam current impinging on a target;
   scanning means for deflecting the ion beam in a controlled pattern, said pattern including predetermined excursions of the ion beam off a surface of said target;
   timing means to generate timing signals coordinated with the predetermined excursions of said beam off said target;
   comparator means to compare sensed ion beam current at intervals coordinated with the timing signals and expected beam current during said predetermined excursions; and
   alarm means coupled to the comparator means to alert a system operator of a discreparcy between sensed ion beam current and expected beam current.

6. The scan alarm of claim 5 wherein the comparator means comprises a comparing amplifier, a pulse generating means and a counter, said comparing amplifier to compare the output of the ion beam sensing means to a reference voltage, said pulse generating means coupled to the output of the comparing amplifier and the timing signal generated by the timing means, and said counter to count the pulses generated by the pulse generating means.

7. The scan alarm of claim 8 wherein the pulse generating means comprises a D flip-flop.

8. Apparatus for use with an ion bean scanning system to treat a workpiece, said apparatus comprising:
   video display means having a viewing screen and controls for creating an image on the viewing screen, said controls including first and second display inputs for controllably deflecting an imaging ray across said screen;
   ion beam measuring means for measuring ion beam current and coupling a beam current signal to said first display input;
   ion beam scanning means to controllably deflect the ion beam away from an initial trajectory to sweep a workpiece surface;

timing means coordinated with the ion beam scanning means to create timing signals coordinated with the deflection of the ion beam;

sweep generator means responsive to said timing signals to create a sweep signal coupled to said second display input;

delay means interposed between the sweep generator and the timing means to delay the sweep signal by an amount related to a time of flight of said ion beam between the ion beam scanning means and the workpiece; and correcting means for centering the beam characterizing image of scan segments of unequal length on the screen, said correcting means including adding means for superposing a voltage fixed with respect to the length of each scan segment onto the timing signal coordinated with the deflection of the ion beam, said adding means interposed between said timing means and said second display input.

9. The apparatus of claim 8, wherein:

said sweep generator comprises a counter, a clock and a digital-to-analog converter, said digital-to-analog converter having an output coupled to said second display input;

said counter is enabled by said delay means and clocked at a constant rate by the clock to generate said sweep signal; and said counter is reprogrammed for each scan segment with an initial count related to one-half the difference between the length of the scan segment and the length of the maximum length segment.

10. The apparatus of claim 8 including control means for adjusting or correcting the delay time of the delay means depending on ion species or beam energy.

* * * * *